(12) United States Patent
Gong et al.

(10) Patent No.: US 10,551,695 B2
(45) Date of Patent: Feb. 4, 2020

(54) MANUFACTURING METHOD OF ARRAY SUBSTRATE, ARRAY SUBSTRATE AND DISPLAY APPARATUS

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventors: Kui Gong, Beijing (CN); Xianxue Duan, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 90 days.

(21) Appl. No.: 15/866,020

(22) Filed: Jan. 9, 2018

(65) Prior Publication Data
US 2018/0329266 A1 Nov. 15, 2018

(30) Foreign Application Priority Data

May 10, 2017 (CN) .......................... 2017 1 0326373

(51) Int. Cl.
*G02F 1/1343* (2006.01)
*G02F 1/1362* (2006.01)
(Continued)

(52) U.S. Cl.
CPC ........ *G02F 1/13439* (2013.01); *G02F 1/1368* (2013.01); *G02F 1/133345* (2013.01);
(Continued)

(58) Field of Classification Search
CPC ......... G02F 1/133345; G02F 1/136227; G02F 2001/136231; G02F 1/1368; G02F 1/13439; H01L 29/786
See application file for complete search history.

(56) References Cited

U.S. PATENT DOCUMENTS

2011/0194063 A1* 8/2011 Lee .................... G02F 1/1333
349/153
2011/0256376 A1* 10/2011 Compton .................. B32B 9/04
428/220
(Continued)

FOREIGN PATENT DOCUMENTS

CN 102629035 A 8/2012
CN 104835729 A 8/2015
(Continued)

OTHER PUBLICATIONS

First Office Action for CN Application No. 201710326373.1, dated Apr. 18, 2019.

*Primary Examiner* — Jia X Pan
(74) *Attorney, Agent, or Firm* — Foley & Lardner LLP; James F. Ewing; Paul M. H. Pua

(57) ABSTRACT

The embodiments of the present disclosure provide a method of manufacturing an array substrate, an array substrate and a display apparatus. A method of manufacturing an array substrate, comprising: providing a substrate; forming, on the substrate, a source electrode, a drain electrode and a passivation layer, wherein a via reaching the source electrode or the drain electrode is formed in the passivation layer by a patterning process; forming a carbon film layer on the passivation layer; forming a photoresist layer on the carbon film layer; patterning the photoresist layer to form a first region and a second region, wherein the first region exposes a portion of the carbon film layer; using the photoresist layer as a mask, modifying the portion of the carbon (Continued)

film layer exposed from the first region to change the electrical conductivity of the portion of the carbon film layer; and removing the photoresist layer.

12 Claims, 6 Drawing Sheets

(51) Int. Cl.
    *G02F 1/1333*     (2006.01)
    *H01L 29/786*     (2006.01)
    *G02F 1/1368*     (2006.01)

(52) U.S. Cl.
    CPC ...... *G02F 1/136227* (2013.01); *H01L 29/786* (2013.01); *G02F 2001/136231* (2013.01)

(56) References Cited

U.S. PATENT DOCUMENTS

| | | | |
|---|---|---|---|
| 2012/0062561 A1* | 3/2012 | Koyama | H04N 13/341 345/419 |
| 2012/0112346 A1* | 5/2012 | Ning | B82Y 30/00 257/746 |
| 2013/0133925 A1* | 5/2013 | Kim | H01B 13/34 174/126.4 |
| 2017/0033792 A1* | 2/2017 | Takahashi | H01L 27/1225 |
| 2017/0199407 A1* | 7/2017 | Yang | G02F 1/136227 |
| 2017/0271524 A1* | 9/2017 | Wu | H01L 29/06 |
| 2018/0107301 A1* | 4/2018 | Kimura | G02F 1/136286 |

FOREIGN PATENT DOCUMENTS

| | | |
|---|---|---|
| CN | 104944414 A | 9/2015 |
| CN | 106526991 A | 3/2017 |

\* cited by examiner

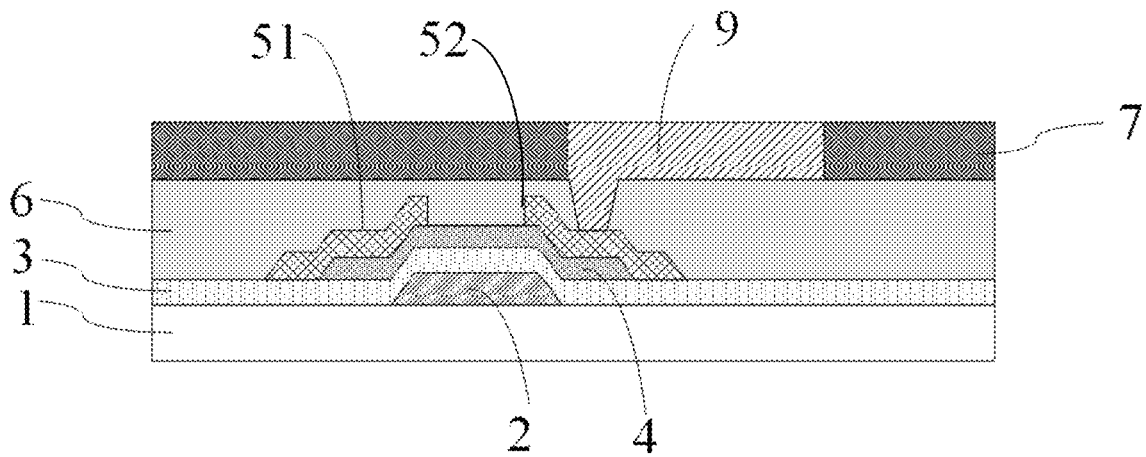

Fig. 7 providing a substrate including: a base substrate, a gate electrode, a gate insulating layer, an active layer, a source electrode, a drain electrode and a passivation layer, wherein a via is provided in the passivation layer to expose the drain electrode — 301 forming a graphene layer on the passivation layer by sputtering, thermal evaporation, spin coating, spray coating or slit coating, and filling the via exposing the drain electrode — 302 forming a photoresist layer on the carbon film layer — 303 performing an exposure process on the photoresist layer corresponding to a pixel define layer region to form an exposed region and a non-exposed region — 304 performing a development process on the photoresist layer. The exposed region forms the first region where there is no photoresist, and exposes the graphene layer corresponding to the pixel define layer region. The non-exposed region forms the second region where the photoresist remains, and covers the graphene layer corresponding to an anode of OLED — 305 using the photoresist layer as a mask, performing an oxidation process on the graphene layer exposed from the first region to obtain a pixel define layer made of graphene oxide, wherein the graphene layer that is covered by the second region and is not subjected to the oxidation process forms an anode — 306 removing the photoresist layer — 307

Fig. 8

MANUFACTURING METHOD OF ARRAY SUBSTRATE, ARRAY SUBSTRATE AND DISPLAY APPARATUS

CROSS REFERENCE

This application claims priority to Chinese Patent Application No. 201710326373.1, filed on May 10, 2017, which is hereby incorporated by reference in its entirety.

FIELD OF THE DISCLOSURE

The present disclosure relates to the technical field of displays, particularly to a manufacturing method of an array substrate, an array substrate and a display apparatus.

BACKGROUND

With the development trend of display panels towards light weight, thin thickness, low power consumption and portability, a new generation of display technology represented by OLED (Organic Light Emitting Diode) has drawn a great deal of attention. Compared with the LCD display technology, OLED has the advantages of light weight, thin thickness, low power consumption, low driving voltage, good viewing angle and contrast, and fast response.

SUMMARY

An embodiment of the present disclosure provides a method of manufacturing an array substrate, comprising:
  providing a substrate;
  forming, on the substrate, a source electrode, a drain electrode and a passivation layer, wherein a via reaching the source electrode or the drain electrode is formed in the passivation layer by a patterning process;
  forming a carbon film layer on the passivation layer;
  forming a photoresist layer on the carbon film layer;
  patterning the photoresist layer to form a first region where there is no photoresist and a second region where the photoresist remains, wherein the first region exposes a portion of the carbon film layer;
  using the photoresist layer as a mask, modifying the portion of the carbon film layer exposed from the first region to change the electrical conductivity of the portion of the carbon film layer;
  removing the photoresist layer.

Preferably, the carbon film layer is a graphene oxide layer, and the step of forming the carbon film layer on the passivation layer comprises:
  dispersing graphene oxide in a solvent to form a suspension;
  coating the suspension on the passivation layer and filling the via;
  heating the suspension on the passivation layer and evaporating the solvent of the suspension to obtain the graphene oxide layer.

Preferably, the step of patterning the photoresist layer to form a first region where there is no photoresist and a second region where the photoresist remains comprises:
  performing an exposure process on the photoresist layer corresponding to the portion of the carbon film layer to form an exposed region and a non-exposed region;
  performing a development process on the photoresist layer, wherein the exposed region forms the first region exposing the portion of the carbon film layer, and the non-exposed region forms the second region.

Preferably, the step of using the photoresist layer as a mask, modifying the portion of the carbon film layer exposed from the first region to change the electrical conductivity of the portion of the carbon film layer comprises:
  using the photoresist layer as a mask, performing a reduction process on the graphene oxide layer exposed from the first region to obtain graphene.

Preferably, performing a reduction process on the graphene oxide layer exposed from the first region comprises:
  treating the graphene oxide layer exposed from the first region with a hydrogen or argon plasma to reduce the graphene oxide into graphene.

Preferably, the array substrate is used for a liquid crystal display, and the graphene obtained by the reduction process is used as a pixel electrode.

Preferably, the array substrate is used for an organic light emitting diode display, and the graphene obtained by the reduction process is used as an anode of an organic light emitting diode.

Preferably, the carbon film layer is a graphene layer, and the step of forming the carbon film layer on the passivation layer comprises:
  forming a graphene layer on the passivation layer by sputtering, thermal evaporation, spin coating, spray coating or slit coating, and filling the via.

Preferably, the step of patterning the photoresist layer to form a first region where there is no photoresist and a second region where the photoresist remains, wherein the first region exposes a portion of the carbon film layer comprises:
  performing an exposure process on the photoresist layer corresponding to the portion of the carbon film to form an exposed region and a non-exposed region;
  performing a development process on the photoresist layer, wherein the exposed region forms the first region exposing the portion of the carbon film layer, and the non-exposed region forms the second region.

Preferably, the step of using the photoresist layer as a mask, modifying the portion of the carbon film layer exposed from the first region to change the electrical conductivity of the portion of the carbon film layer comprises:
  using the photoresist layer as a mask, performing an oxidation process on the graphene layer exposed from the first region to obtain graphene oxide.

Preferably, the oxidation process comprises:
  Implanting, via an ion implantation process, fluorine ions into the graphene layer exposed from the first region, so that the graphene layer exposed from the first region is converted into a graphene oxide of electric insulation property.

Preferably, the array substrate is used for a liquid crystal display, and a portion of the graphene layer that is covered by the second region of the photo resist layer is used as a pixel electrode.

Preferably, the array substrate is used for an organic light emitting diode display, and the graphene oxide obtained by the oxidation process is used as a pixel define layer, and the portion of the graphene that is covered by the second region of the photo resist layer is used as an anode of an organic light emitting diode.

Another embodiment of the present disclosure provides an array substrate for a liquid crystal display, wherein the array substrate comprises:
  a substrate;
  a source electrode and a drain electrode formed on the substrate;
  a passivation layer covering the source electrode and the drain electrode; and an insulation layer and a pixel electrode formed on the passivation layer, the pixel electrode being electrically connected to the source electrode or the drain electrode through a via in the passivation layer, wherein a material of the insulation layer is graphene oxide, a material of the pixel electrode is graphene, and the insulation layer and the pixel electrode are formed by performing a modification process on a portion of a carbon film layer on the passivation layer.

Preferably, a top surface of the insulation layer and a top surface of the pixel electrode are parallel with the surface of the substrate and are in a same continuous plane. The top surface refers to the surface that is opposite to a surface facing the substrate.

A further embodiment of the present disclosure provides an array substrate for an organic light emitting diode display, wherein the array substrate comprises:

a substrate;

a source electrode and a drain electrode formed on the substrate;

a passivation layer covering the source electrode and the drain electrode; and a pixel define layer and an anode of an organic light emitting diode formed on the passivation layer, the anode being electrically connected to the source electrode or the source electrode or the drain electrode through a via in the passivation layer, wherein a material of the pixel define layer is graphene oxide, a material of the anode is graphene, and the pixel define layer and the anode are formed by performing a modification process on a portion of a carbon film layer on the passivation layer.

A still further embodiment of the present disclosure provides a display apparatus, comprising the array substrate as described in the embodiments of the present disclosure.

BRIEF DESCRIPTION OF THE DRAWINGS

FIG. 7 is a diagram showing the structure after removing the photoresist layer in the manufacturing method of an array substrate according to an embodiment of the present disclosure;

FIG. 8 is a flow chart of a manufacturing method of an array substrate according to an embodiment of the present disclosure;

DETAILED DESCRIPTION

In order to allow a person skilled in the art to better understand the solution of the present utility model, next the present utility model will be further explained in detail in combination with the drawings and the embodiments.

An important part of an OLED display is a TFT (Thin Film Transistor) array substrate. Currently, the manufacturing process of a TFT-OLED display device generally comprises: upon the manufacture of a TFT array, digging a hole in an insulating layer on the top of the source/drain (S/D) electrodes of the TFT array in a patterning process to expose the S/D electrode, depositing a layer of ITO (Indium Tin Oxide) on the insulating layer, and then patterning the ITO pattern again in a patterning process to form a pixel electrode connected to the S/D electrode of the TFT array. Since the ITO forms a layer protruded over the insulating layer of the TFT array, in order to prevent the occurrence of a short circuit during the process of manufacturing an OLED device on the periphery of a pixel electrode, a pixel define layer (pixel bank) is formed through film forming and patterning processes to cover the periphery of the pixel electrode ITO, so that the manufacturing process is complicated, and the manufacturing cost is increased.

Figure 1:
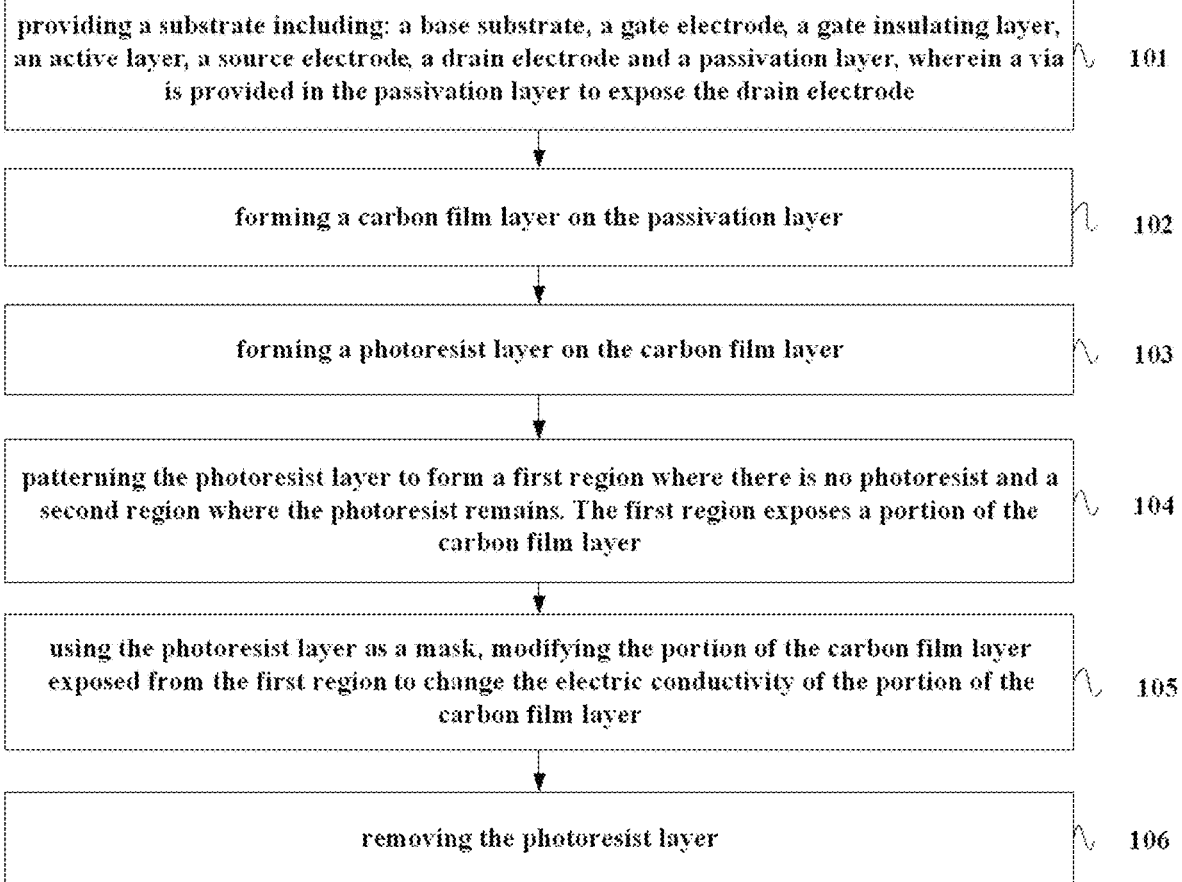
FIG. 1 is a flow chart of a manufacturing method of an array substrate according to an embodiment of the present disclosure.

FIG. 1 is a flow chart of a manufacturing method of an array substrate according to an embodiment of the present disclosure.

As shown in FIG. 1, the manufacturing method of an array substrate according to the embodiment of the present disclosure comprises:

step 101: providing a substrate including: a base substrate, a gate electrode, a gate insulating layer, an active layer, a source electrode, a drain electrode and a passivation layer, wherein a via is provided in the passivation layer to expose the drain electrode.

Figure 2:
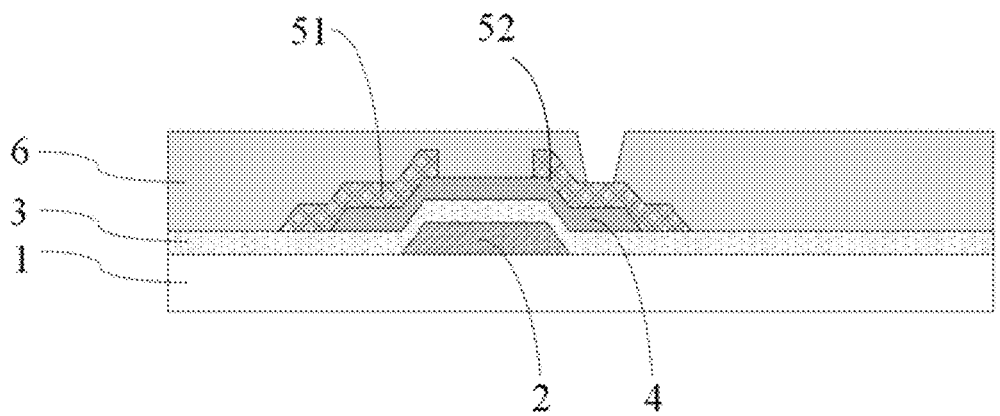
FIG. 2 is a structure diagram showing a substrate before forming a pixel define layer and a pixel electrode in the manufacturing method of an array substrate of the present disclosure.

FIG. 2 shows a substrate before forming a pixel define layer and an anode according to the embodiment of the present disclosure. On substrate 1, a gate electrode 2, a gate insulating layer 3, an active layer 4, a source electrode 51, a drain electrode 52, and a passivation layer 6 have been formed, and a via is formed on the passivation layer 6 with a patterning process, so that when an anode is formed, the anode can be electrically connected to the drain electrode 52 by the via.

step 102: forming a carbon film layer on the passivation layer.

According to an exemplary embodiment of the present disclosure, the array substrate is used for an organic light emitting diode (OLED) display. A pixel define layer and an anode of the OLED are prepared on the substrate. The carbon film layer can change its property of electrical conductivity (e.g., from a conductor to an insulator, or from an insulator to a conductor) by a modification process. Thus, the pixel define layer (by the insulator) and the anode (by the conductor) are formed. For example, in some embodiments of the present disclosure, the material of the carbon film layer may be graphene or graphene oxide. However, the material of the carbon film layer is not limited to the graphene or graphene oxide. The process of forming the carbon film layer on the passivation layer can be determined based on the material of the carbon film layer.

step 103: forming a photoresist layer on the carbon film layer.

The photoresist is a light-sensitive material that changes its properties when irradiated by light. The photoresist is mainly used to copy the pattern of a photolithographic mask to the carbon film layer.

The photoresist may be either positive or negative. Upon exposure, a light-exposed portion of the positive photoresist becomes easily dissolved and is dissolved after development, only remaining an unexposed portion that forms a pattern. In the case of a negative photoresist, its light-exposed portion becomes difficult to dissolve, and a pattern is formed by the light-exposed portion after development.

Forming a photoresist layer on the carbon film layer may comprise steps of cleaning the carbon film layer, drying it to remove moisture, applying a compound for enhancing the adhesion of the photoresist layer, coating a photoresist layer, and drying the photoresist layer, etc.

step 104: patterning the photoresist layer to form a first region where there is no photoresist and a second region where the photoresist remains. The first region exposes a portion of the carbon film layer.

The carbon film layer of the embodiment of the present disclosure may be graphene or graphene oxide. Depending on the material of the carbon film layer, different photolithographic masks are used in the patterning process performed on the photoresist layer, leading to different first region where there is no photoresist and second region where the photoresist remains. The photoresist layer is patterned by exposing the photoresist layer to light and copying the pattern of the photolithographic mask to the photoresist layer to form the first region where there is no photoresist and the second region where the photoresist remains.

step 105: using the photoresist layer as a mask, modifying the portion of the carbon film layer exposed from the first region to change the electrical conductivity of the portion of the carbon film layer, for example, from an insulator to an conductor, or from an conductor to an insulator.

After obtaining a patterned photoresist layer, depending on the material of the carbon film layer and using the photoresist layer as a mask, the portion of the carbon film layer that is exposed from the first region of the photoresist is modified, such that the electrical conductivity of the portion of the carbon film layer exposed from the first region changes.

step 106: removing the photoresist layer.

After the modification process performed on the carbon film layer, the photoresist layer is no longer needed and the photoresist layer can be removed, so that the array substrate enters a next process. The photoresist layer can be removed by wet stripping or dry stripping, wherein wet stripping further comprises organic solvent stripping and inorganic solvent stripping. Organic solvent stripping is mainly used for dissolving the photoresist layer in an organic solvent to remove the photoresist layer. Inorganic solvent stripping works because the photoresist layer itself is organic matter. With some inorganic solvent, the carbon element in the photoresist layer is oxidized to carbon dioxide and is removed. In dry stripping, the photoresist layer is stripped using a plasma.

According to the manufacturing method of an array substrate provided in the embodiment of the present disclosure, after forming the carbon film layer on the substrate, only one film-forming and patterning process is required. Firstly, a photoresist layer is formed on the carbon film layer. Then, with the photoresist layer as a mask, a modification process is performed on the corresponding region of the carbon film layer exposed from the first region. Thus, an insulation region and an electrically conductive region are obtained in the carbon film layer at the same time. This can be used to form the pixel define layer and the anode of the OLED at the same time, without the need of forming an additional pixel define layer covering the periphery of the anode through another film-forming and patterning process. The manufacturing process of the array substrate is simplified and the cost is saved.

Further, the above embodiment describes the array substrate for an OLED display, but a skilled person may understand that the above array substrate may also be used to a liquid crystal display (LCD) where the graphene oxide layer may be acted as an insulation layer, and the graphene obtained by the reduction process may be acted as a pixel electrode.

Figure 3:
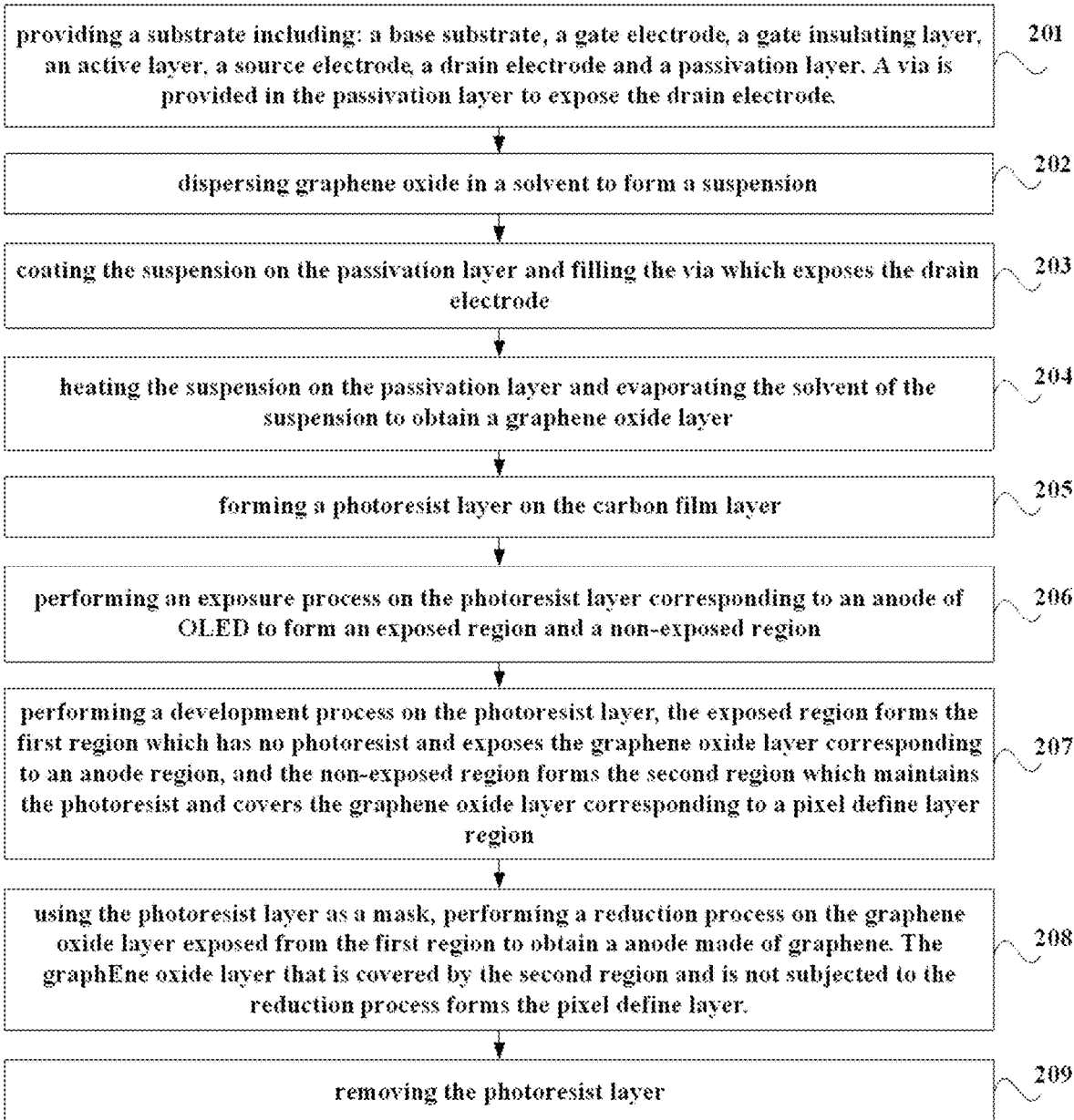
FIG. 3 is a flow chart of a manufacturing method of an array substrate according to an embodiment of the present disclosure.

FIG. 3 is a flow chart of a manufacturing method of an array substrate according to an embodiment of the present disclosure.

As shown in FIG. 3, the manufacturing method of an array substrate according to the embodiment of the present disclosure comprises:

step 201: providing a substrate including: a base substrate, a gate electrode, a gate insulating layer, an active layer, a source electrode, a drain electrode and a passivation layer. A via is provided in the passivation layer to expose the drain electrode.

step 202: dispersing graphene oxide in a solvent to form a suspension;

step 203: coating the suspension on the passivation layer and filling the via which exposes the drain electrode;

step 204: heating the suspension on the passivation layer and evaporating the solvent of the suspension to obtain a graphene oxide layer.

Particularly, the graphene oxide may be a powder. During the production of the graphene oxide layer, the graphene oxide powder is mixed with a solvent. The solvent can be selected from highly volatile solvents, such as ethanol. At the same time, a curing agent such as polymethylmethacrylate (PMMA) can be added. Preferably, the proportion of the added curing agent is selected to facilitate the coating and film-forming processes. By mixing, a graphene oxide suspension is finally obtained.

Figure 4:
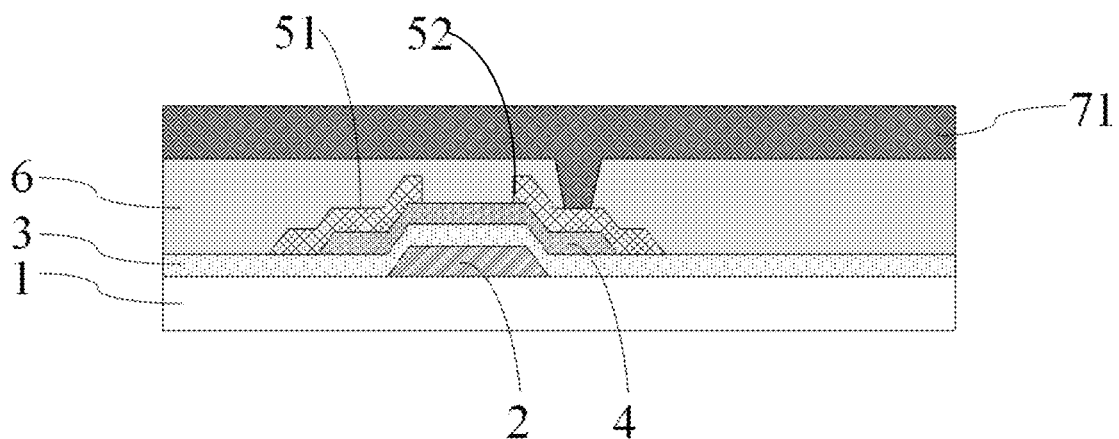
FIG. 4 is a structure diagram showing a carbon film layer formed in a manufacturing method of an array substrate according to an embodiment of the present disclosure.

As shown in FIG. 4, a uniform layer of the graphene oxide suspension may be formed on the passivation layer 6 by printing, inkjet printing or coating, and the drain via hole may be filled with the graphene oxide suspension. Then, the solvent of the graphene oxide suspension is evaporated through heating. Under the effect of the curing agent, a graphene oxide layer 71 is formed on the passivation layer 6.

step 205: forming a photoresist layer on the carbon film layer;

step 206: performing an exposure process on the photoresist layer corresponding to an anode of OLED to form an exposed region and a non-exposed region;

step 207: performing a development process on the photoresist layer, the exposed region forms the first region which has no photoresist and exposes the graphene oxide layer corresponding to an anode region, and the non-exposed region forms the second region which maintains the photoresist and covers the graphene oxide layer corresponding to a pixel define layer region.

In the embodiment of the present disclosure, the array substrate is used for an OLED display, the patterns of the pixel define layer and the anode on the substrate may be provided on the photolithographic mask. The patterning process is used for copying the patterns of the photolithographic mask to the photoresist layer to form the first region where there is no photoresist and the second region where the photoresist remains. The first region exposes the graphene oxide layer corresponding to the anode region. The second region covers the graphene oxide layer corresponding to the pixel define layer region. The graphene oxide layer exposed from the first region can be processed later with the photoresist layer as a mask.

Figure 5:
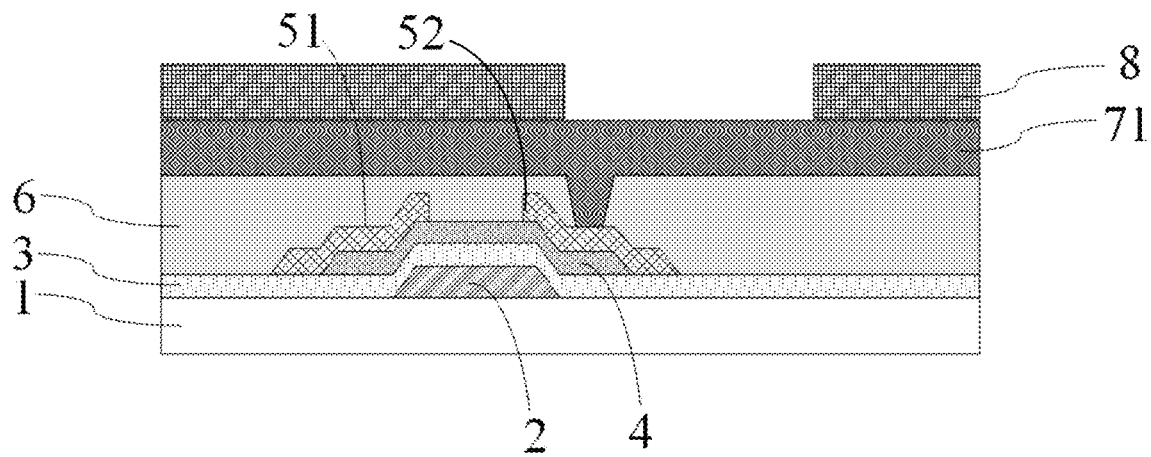
FIG. 5 is a structure diagram showing a photoresist layer obtained after a patterning process in the manufacturing method of an array substrate according to an embodiment of the present disclosure.

As shown in FIG. 5, a layer of photoresist can be formed on the graphene oxide layer 71. The photoresist layer initially covers the entire graphene oxide layer 71. Then, the photoresist layer is exposed to light with a photolithographic mask including patterns. Due to the properties of the photoresist layer itself, a light-exposed portion changes from a non-soluble material to a soluble material after exposure. As shown in FIG. 5, the first region of the photoresist layer (the gap portion in the figure where there is no photoresist) changes from a non-soluble material to a soluble material. In a development process, because the first region is of a soluble material, it is completely removed through cleaning to form a photoresist layer 8 exposing the graphene oxide layer corresponding to the anode region of FIG. 5. The graphene oxide layer covered by the second region of the photoresist layer 8 where the photoresist remains forms the pixel define layer region.

Certainly, the photoresist layer may be negative, i.e., a light-exposed portion becomes a non-soluble material and an unexposed portion becomes a soluble material. The embodiment of the present disclosure does not have limitation on the type (positive or negative) of the photoresist layer.

step 208: using the photoresist layer as a mask, performing a reduction process on the graphene oxide layer exposed from the first region to obtain a anode made of graphene. The graphene oxide layer that is covered by the second region and is not subjected to the reduction process forms the pixel define layer.

Figure 6:
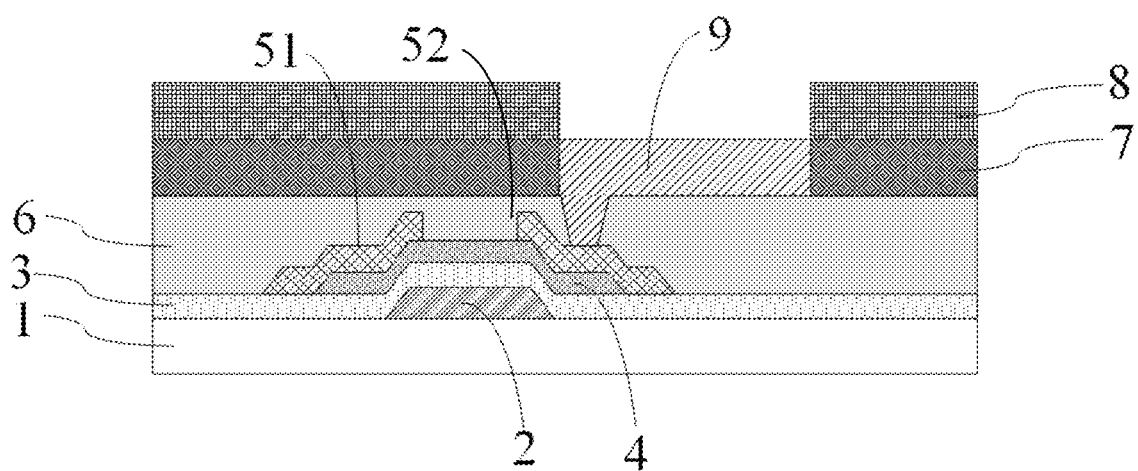
FIG. 6 is a structure diagram showing the carbon film layer after a modification process in a manufacturing method of an array substrate according to an embodiment of the present disclosure.

As shown in FIG. 6, the graphene oxide layer exposed from the first region of the photoresist layer 8 can be treated with a plasma such as a hydrogen plasma or argon plasma, so that the graphene oxide is reduced to graphene. Graphene has good electrical conductivity and can be used as the anode 9. The graphene oxide covered by the second region of the photoresist layer 8 is not subjected to the reduction process and is still of graphene oxide. Graphene oxide is an insulator which can be used as the pixel define layer 7.

step 209: removing the photoresist layer.

As shown in FIG. 7, after the photoresist layer 8 is removed, the portion of the graphene oxide that has been reduced to graphene is the anode 9, and the unreduced portion of the graphene oxide layer is the pixel define layer 7.

After the anode 9 and the pixel define layer 7 has been formed, an OLED light emitting device can be formed on the pixel electrode 9 and then is packaged to obtain an array substrate.

Thus, according to the manufacturing method of an array substrate provided in the embodiment of the present disclosure, after the forming of the carbon film layer, only one film-forming and patterning process is required to form the pixel define layer and the anode at the same time, without the need of forming an additional pixel define layer covering the periphery of the anode in another film-forming and patterning process to prevent short circuits occurred during the manufacturing of the OLED light emitting device, so that the manufacturing process of the array substrate is simplified, the cost is saved, and the quality of the product is improved.

In the embodiment of the present disclosure, a top surface of the anode and a top surface of the pixel define layer (opposite to the surface that faces the base substrate) are located in the same continuous plane, so that a problem in the forming of the cathode that the cathode is too thin and may be broken due to an obvious difference between the anode and the pixel define layer can be solved. Thereby, the yield of the product is improved.

Further, the above embodiment is described with an example of OLED display. However, a person skilled in the art should understand, the above array substrate can also be used for a LCD where the graphene oxide layer can be used as an insulation layer and the graphene obtained by the reduction process can be used as a pixel electrode.

FIG. 8 is a flow chart of a manufacturing method of an array substrate according to an embodiment of the present disclosure.

As shown in FIG. 8, the manufacturing method of an array substrate according to the embodiment of the present disclosure comprises:

step 301: providing a substrate including: a base substrate, a gate electrode, a gate insulating layer, an active layer, a source electrode, a drain electrode and a passivation layer, wherein a via is provided in the passivation layer to expose the drain electrode.

step 302: forming a graphene layer on the passivation layer by sputtering, thermal evaporation, spin coating, spray coating or slit coating, and filling the via exposing the drain electrode.

In the embodiment of the present disclosure, the carbon film layer is a graphene layer.

Figure 9:
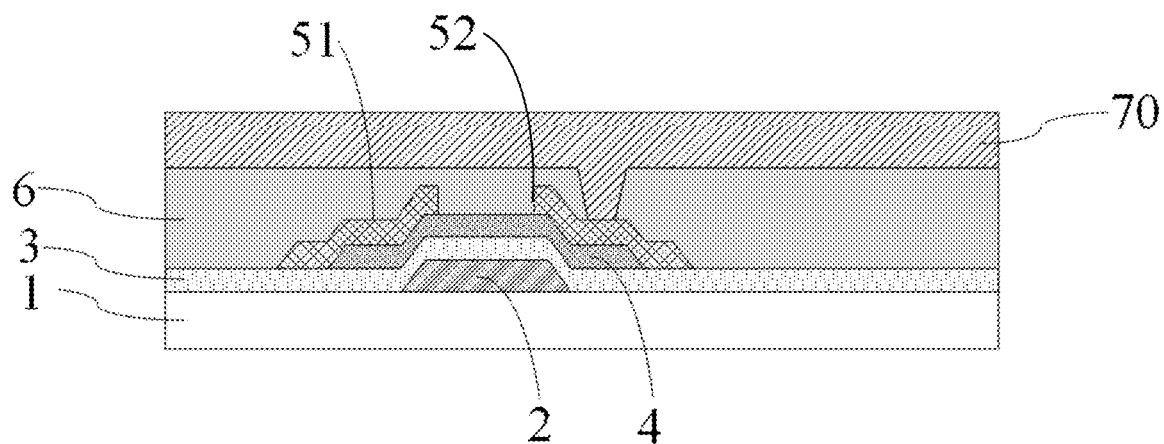
FIG. 9 is a structure diagram showing a carbon film layer formed in the manufacturing method of an array substrate according to an embodiment of the present disclosure.

As shown in FIG. 9, a graphene layer 70 is formed on the passivation layer 6 by sputtering, thermal evaporation, spin coating, spray coating or slit coating, and the drain via hole is filled with graphene.

step 303: forming a photoresist layer on the carbon film layer;

step 304: performing an exposure process on the photoresist layer corresponding to a pixel define layer region to form an exposed region and a non-exposed region;

step 305: performing a development process on the photoresist layer. The exposed region forms the first region where there is no photoresist, and exposes the graphene layer corresponding to the pixel define layer region. The non-exposed region forms the second region where the photoresist remains, and covers the graphene layer corresponding to an anode of OLED.

In the embodiment of the present disclosure, the patterns of the pixel define layer region and the anode region may be provided on a photolithographic mask. A patterning process is used for copying the patterns of the photolithographic mask to the photoresist layer, so that the graphene layer exposed from the photoresist layer can be processed later with the photoresist layer as a mask.

Figure 10:
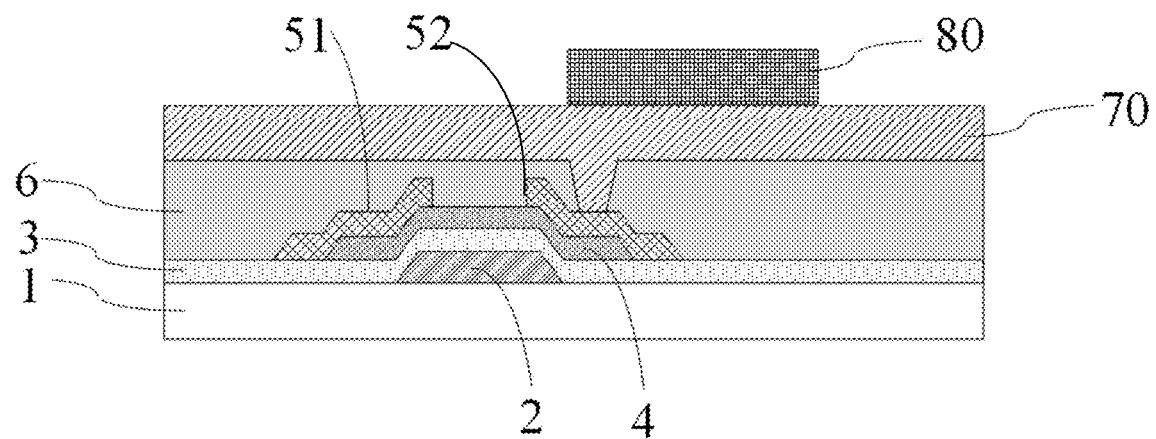
FIG. 10 is a structure diagram showing a photoresist layer obtained after a patterning process in the manufacturing method of an array substrate according to an embodiment of the present disclosure.

As shown in FIG. 10, a layer of photoresist can be formed on the graphene layer 70. The photoresist layer initially covers the entire graphene layer 70. Then, the photoresist layer is exposed to light with a photolithographic mask including patterns. Due to the properties of the photoresist layer itself, a light-exposed portion of the photoresist layer changes from a non-soluble material to a soluble material after exposure. As shown in FIG. 10, the first region of the photoresist layer (the region where the graphene 70 is exposed) changes from a non-soluble material to a soluble material. In a development process, the portion including the non-soluble material is completely removed through cleaning to form a photoresist layer 80 including a first region exposing the pixel define layer region and a second region covering the anode as shown in FIG. 10.

Certainly, the photoresist layer may be negative, i.e., a light-exposed portion becomes a non-soluble material and an unexposed portion becomes a soluble material. The embodiment of the present disclosure does not have limitation on the type (positive or negative) of the photoresist layer.

step 306: using the photoresist layer as a mask, performing an oxidation process on the graphene layer exposed from the first region to obtain a pixel define layer made of graphene oxide, wherein the graphene layer that is covered by the second region and is not subjected to the oxidation process forms an anode.

Figure 11:
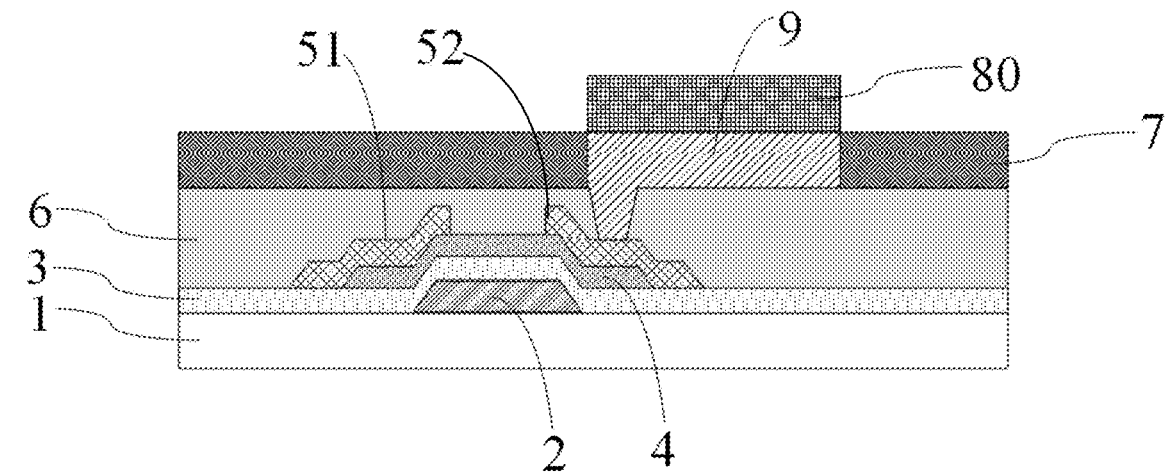
FIG. 11 is a structure diagram showing the carbon film layer after a modification process in the manufacturing method of an array substrate according to an embodiment of the present disclosure.

As shown in FIG. 11, with respect to the graphene layer 70 exposed from the first region of the photoresist layer 80, fluorine ions can be implanted into the graphene layer 70 through ion implantation, so that the graphene layer 70 exposed from the first region changes into graphene oxide 7 to complete the oxidation process. The graphene layer covered by the second region of the photoresist layer 80 is not subjected to the fluorine ions implantation and is still of graphene, which is then used as the pixel electrode 9.

step 307: removing the photoresist layer.

Figure 12:
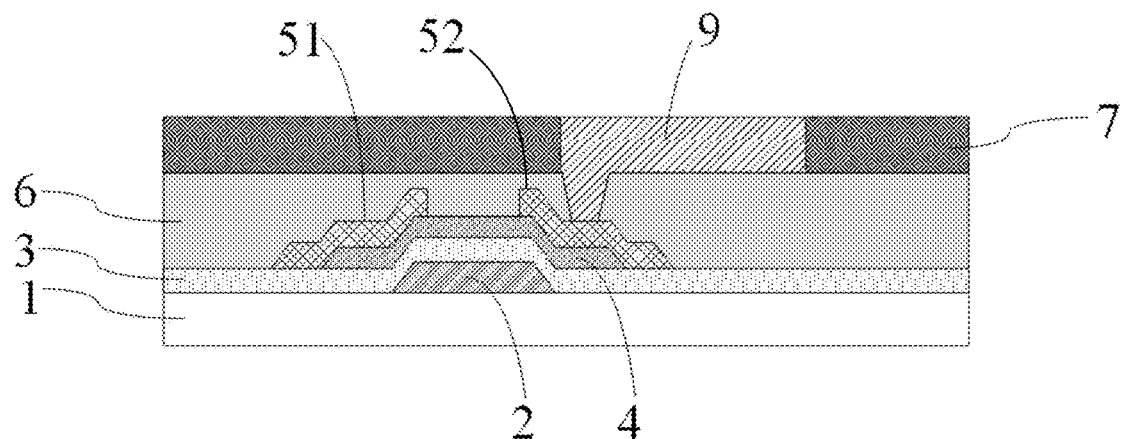
FIG. 12 is a diagram showing the structure after removing the photoresist layer in the manufacturing method of an array substrate according to an embodiment of the present disclosure.

As shown in FIG. 12, after the anode 9 and the pixel define layer 7 are obtained, and after the photoresist layer 80 on the pixel define layer is removed, is an OLED light emitting device can be formed on the anode 9 and then is packaged to obtain an array substrate.

Thus, according to the manufacturing method of an array substrate provided in the embodiment of the present disclosure, after the forming of the carbon film layer, only one film-forming and patterning process is required to form the pixel define layer and the anode at the same time, without the need of forming an additional pixel define layer covering the periphery of the anode in another film-forming and patterning process to prevent short circuits occurred during the manufacturing of the OLED light emitting device, so that the manufacturing process of the array substrate is simplified, the cost is saved, and the quality of the product is improved.

In the embodiment of the present disclosure, a top surface of the anode and a top surface of the pixel define layer (which is opposite to the surface facing the base substrate) are located in the same continuous plane, so that a problem in the forming of the cathode that the cathode is too thin and may be broken due to an obvious difference between the anode and the pixel define layer can be solved. Thereby, the yield of the product is improved.

Further, the above embodiment describes the array substrate for an OLED display, but a skilled person may understand that the above array substrate may also be used to a LCD where the graphene oxide layer may be acted as an insulation layer, and the graphene obtained by the reduction process may be acted as a pixel electrode.

Figure 13:
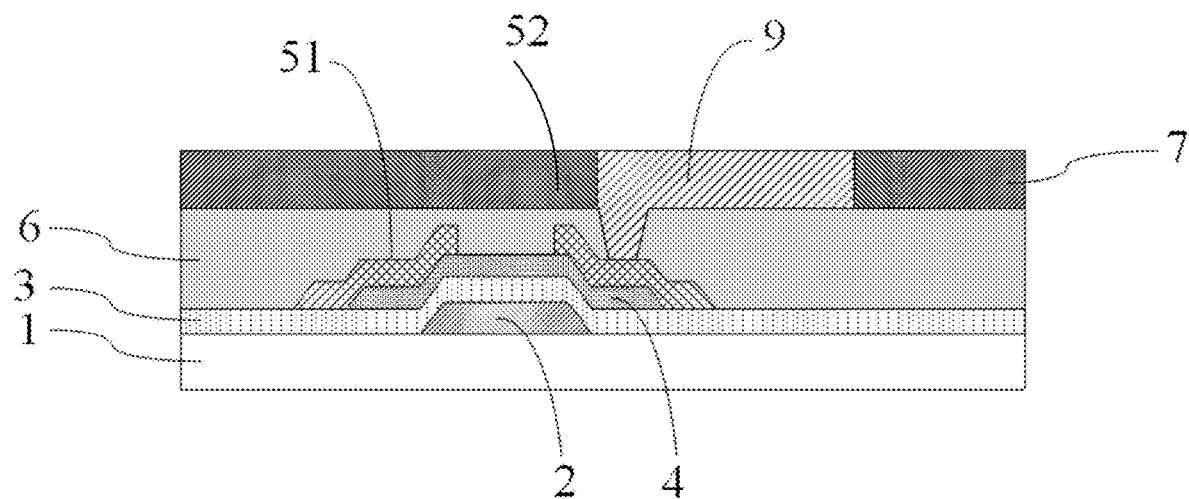
FIG. 13 is a schematic view showing the structure of an array substrate according to an embodiment of the present disclosure.

FIG. 13 is a schematic view showing the structure of an array substrate according to an embodiment of the present disclosure.

As shown in FIG. 13, the array substrate according to the embodiment of the present disclosure comprises: a base substrate 1, a gate electrode 2 formed on the base substrate 1, a gate insulating layer 3 covering the gate electrode 2, an active layer 4 forming on the gate insulating layer 3, a source electrode 51 and a drain electrode 52 formed on the active layer 4, a passivation layer 6 covering the gate insulating layer 3, the source electrode 51 and the drain electrode 52, a pixel define layer 7 and an anode 9 formed on the passivation layer 6, the pixel electrode 9 being electrically connected to the drain electrode 52 by a via in the passivation layer 6, wherein the material of the pixel define layer 7 is graphene oxide and the material of the anode 9 is graphene.

Preferably, a top surface of the pixel define layer 7 and a top surface of the anode 9 (which is opposite to the surface facing the base substrate 1) are parallel with the base substrate 1 and are in the same continuous plane.

Preferably, after one film-forming and patterning process, the pixel define layer 7 and the anode 9 are formed on the passivation layer 6 through a modification process.

The electron mobility of graphene at room temperature exceeds 15000 cm$^2$/V·s and the resistivity of graphene is on the order of $10^6$ Ω/m, which is a good material for an electrode. Graphene oxide can be obtained by oxidation of graphene and can also be reduced to graphene. Graphene oxide has a high resistivity and is a good material for an insulating layer, can be used as a pixel defining layer, and has a good isolation effect.

Graphene can be produced in a simple method and can be used to form a OLED anode with a cost lower than ITO. In addition, the electron mobility of graphene is higher than ITO, the electrode can be made thinner, more transparent, and better in conductivity, which is advantageous to the development of ultra-thin flexible OLED displays.

Thus, according to the array substrate of the embodiment of the present disclosure, after the forming of the carbon film layer, only one film-forming and patterning process is required to form the photoresist layer, and the pixel define layer and the anode can be formed at the same time through a modification process using the photoresist layer as a mask, so that the manufacturing process is simplified and the manufacturing cost is reduced.

In the embodiment of the present disclosure, a top surface of the anode and a top surface of the pixel define layer (which is opposite to the surface facing the base substrate) are located in the same continuous plane, so that a problem in the forming of the cathode that the cathode is too thin and may be broken due to an obvious difference between the anode and the pixel define layer can be solved. Thereby, the yield of the product is improved.

Further, the above embodiment describes the array substrate for an OLED display, but a skilled person may understand that the above array substrate may also be used to a LCD where the graphene oxide layer may act as an insulation layer, and the graphene obtained by the reduction process may act as a pixel electrode.

Further, in the above embodiments, the via is provided on the drain electrode, and the anode or pixel electrode can be electrically connected to the drain electrode through the via. However, a person skilled in the art should understand, the via can also be provided on a source electrode, such that the anode or the pixel electrode may be electrically connected to the source electrode through the via.

A display apparatus is further provided in an embodiment of the present disclosure, which comprises the array substrate described above.

The foregoing embodiments of the method have been described as a series of combinations of actions for convenience of the descriptions, but those skilled in the art shall appreciate that the invention will not be limited to the described sequence of actions because some of the steps can be performed in a different sequence or concurrently according to the invention. Secondly, as appreciated by those skilled in the art, all the embodiments described in the description are preferred embodiments, and activities and modules involved therein are not necessarily required to implement the present disclosure.

Each embodiment in this description is described in a progressive manner and focuses on differences from other embodiments. For the same or similar parts of the various embodiment, reference can be made to each other.

Note that, in this description, the use of relational terms, if any, such as first and second and the like are used solely to distinguish one from another entity or action without necessarily requiring or implying any actual such relationship or order between such entities or actions. Further, terms "include", "comprise" or their any other variations are intended to encompass non-exclusive composition, so that a process, method, product or device comprising a series of factors may comprise not only these factors, but also other factors that are not listed explicitly, or factors intrinsic to this process, method, product or device. Without limitation, a factor defined by wording "comprise one . . . " does not exclude the existence of other same factors in a process, method, product or device comprising such factor.

A manufacturing method of an array substrate, an array substrate and a display apparatus provided in the present disclosure have been described in detail above. Specific examples are applied in this text to elaborate the principles and embodiments of the present utility model, and the aforementioned descriptions of the embodiments are only used to help understanding the method of the present disclosure as well as its core thoughts. For those of ordinary skill in the art, according to the concept of the present disclosure, variations can be made to the embodiments and application scope of the present disclosure. To sum up, the contents of the present disclosure cannot be understood as limitations to the present disclosure.

What is claimed is:

1. A method of manufacturing an array substrate, comprising:
    providing a substrate;
    forming, on the substrate, a source electrode, a drain electrode and a passivation layer, wherein a via reaching the source electrode or the drain electrode is formed in the passivation layer by a patterning process;
    forming a carbon film layer on the passivation layer;
    forming a photoresist layer on the carbon film layer;
    patterning the photoresist layer to form a first region where there is no photoresist and a second region where the photoresist remains, wherein the first region exposes a portion of the carbon film layer;
    using the photoresist layer as a mask, modifying the portion of the carbon film layer exposed from the first region to change the electrical conductivity of the portion of the carbon film layer; and
    removing the photoresist layer,
    wherein the carbon film layer is a graphene oxide layer, and forming the carbon film layer on the passivation layer comprises:
    dispersing graphene oxide and adding polymethylmethacrylate (PMMA) into a solvent at the same time to form a suspension;
    coating the suspension on the passivation layer and filling the via; and
    heating the suspension on the passivation layer and evaporating the solvent of the suspension to obtain the graphene oxide layer.

2. The method according to claim 1, wherein the step of patterning the photoresist layer to form a first region where there is no photoresist and a second region where the photoresist remains comprises:
    performing an exposure process on the photoresist layer corresponding to the portion of the carbon film layer to form an exposed region and a non-exposed region; and
    performing a development process on the photoresist layer, wherein the exposed region forms the first region exposing the portion of the carbon film layer, and the non-exposed region forms the second region.

3. The method according to claim 2, wherein the step of using the photoresist layer as a mask, modifying the portion of the carbon film layer exposed from the first region to change the electrical conductivity of the portion of the carbon film layer comprises:
    using the photoresist layer as a mask, performing a reduction process on the graphene oxide layer exposed from the first region to obtain graphene.

4. The method according to claim 3, wherein performing a reduction process on the graphene oxide layer exposed from the first region comprises:
    treating the graphene oxide layer exposed from the first region with a hydrogen or argon plasma to reduce the graphene oxide into graphene.

5. The method according to claim 3, wherein the array substrate is used for a liquid crystal display, and the graphene obtained by the reduction process is used as a pixel electrode.

6. The method according to claim 3, wherein the array substrate is used for an organic light emitting diode display, and the graphene obtained by the reduction process is used as an anode of an organic light emitting diode.

7. An array substrate for a liquid crystal display, manufactured by using the method according to claim 1, wherein the array substrate comprises:
    a substrate;
    a source electrode and a drain electrode formed on the substrate;
    a passivation layer covering the source electrode and the drain electrode; and
    an insulation layer and a pixel electrode formed on the passivation layer, the pixel electrode being electrically connected to the source electrode or the drain electrode through a via in the passivation layer,
    wherein a material of the insulation layer is graphene oxide, a material of the pixel electrode is graphene, the insulation layer and the pixel electrode are formed by performing a modification process on a portion of a carbon film layer on the passivation layer, and the carbon film layer is a graphene oxide layer.

8. The array substrate according to claim 7, wherein a top surface of the insulation layer and a top surface of the pixel electrode are parallel with a surface of the substrate and are in a same continuous plane.

9. An array substrate for an organic light emitting diode display, manufactured by using the method according to claim 1, wherein the array substrate comprises:
- a substrate;
- a source electrode and a drain electrode formed on the substrate;
- a passivation layer covering the source electrode and the drain electrode; and
- a pixel define layer and an anode of an organic light emitting diode formed on the passivation layer, the anode being electrically connected to the source electrode or the drain electrode through a via in the passivation layer, wherein
- a material of the pixel define layer is graphene oxide, a material of the anode is graphene, the pixel define layer and the anode are formed by performing a modification process on a portion of a carbon film layer on the passivation layer, and the carbon film layer is a graphene oxide layer.

10. A display apparatus, comprising the array substrate according to claim 7.

11. A display apparatus, comprising the array substrate according to claim 8.

12. A display apparatus, comprising the array substrate according to claim 9.

* * * * *